US006937533B2

(12) United States Patent
Hojo et al.

(10) Patent No.: US 6,937,533 B2

(45) Date of Patent: Aug. 30, 2005

(54) SEMICONDUCTOR INTEGRATED CIRCUIT PROVIDED WITH SEMICONDUCTOR MEMORY CIRCUIT HAVING REDUNDANCY FUNCTION AND METHOD FOR TRANSFERRING ADDRESS DATA

(75) Inventors: Takehiko Hojo, Yokohama (JP); Akikuni Sato, Yokohama (JP)

(73) Assignee: Kabushiki Kaisha Toshiba, (JP)

( * ) Notice: Subject to any disclaimer, the term of this patent is extended or adjusted under 35 U.S.C. 154(b) by 0 days.

(21) Appl. No.: 10/809,308

(22) Filed: Mar. 24, 2004

(65) Prior Publication Data

US 2005/0122799 A1 Jun. 9, 2005

(30) Foreign Application Priority Data

Dec. 8, 2003 (JP) ............................ 2003-408587

(51) Int. Cl.[7] ................................................ G11C 7/00

(52) U.S. Cl. .................................. 365/200; 365/225.7

(58) Field of Search ............................... 365/200, 201, 365/225.7, 230.06, 236, 230.03, 189.07

(56) References Cited

U.S. PATENT DOCUMENTS 6,388,929 B1 * 5/2002 Shimano et al. ............ 365/201
6,400,622 B1 * 6/2002 Fujiwara ..................... 365/200
6,545,921 B2 * 4/2003 Ohtani et al. ............... 365/201

FOREIGN PATENT DOCUMENTS

JP 2000-182394 6/2000

OTHER PUBLICATIONS

Ouellette, et al, "Shared Fuse Macro for Multiple Embedded Memory Devices with Redundancy," IBM, Microelectronics Division, ASIC Development, Essex Junction, VT 05452, US, 4 pages, 2001 IEEE.

* cited by examiner

*Primary Examiner*—Gene N. Auduong

(74) *Attorney, Agent, or Firm*—DLA Piper Rudnick Gray Cary US LLP

(57) ABSTRACT

A semiconductor integrated circuit includes a regular cell array, a spare cell array, first and second memory circuits, a determining circuit, a generating circuit and a selecting circuit. When the regular cell array contains a defective regular memory cell, the defective regular memory cell is replaced with a spare memory cell in the spare cell array. Each of the first memory circuits stores data indicating whether an associated spare memory cell is used or not. Any of the second memory circuits stores address data indicating the address of the defective regular memory cell. The determining circuit determines whether each of the spare memory cells is used or not, based on the data stored in an associated first memory circuit. The generating circuit generates predetermined data. The selecting circuit selects and outputs the data generated by the generating circuit or address data stored in each of the second memory circuits.

13 Claims, 6 Drawing Sheets

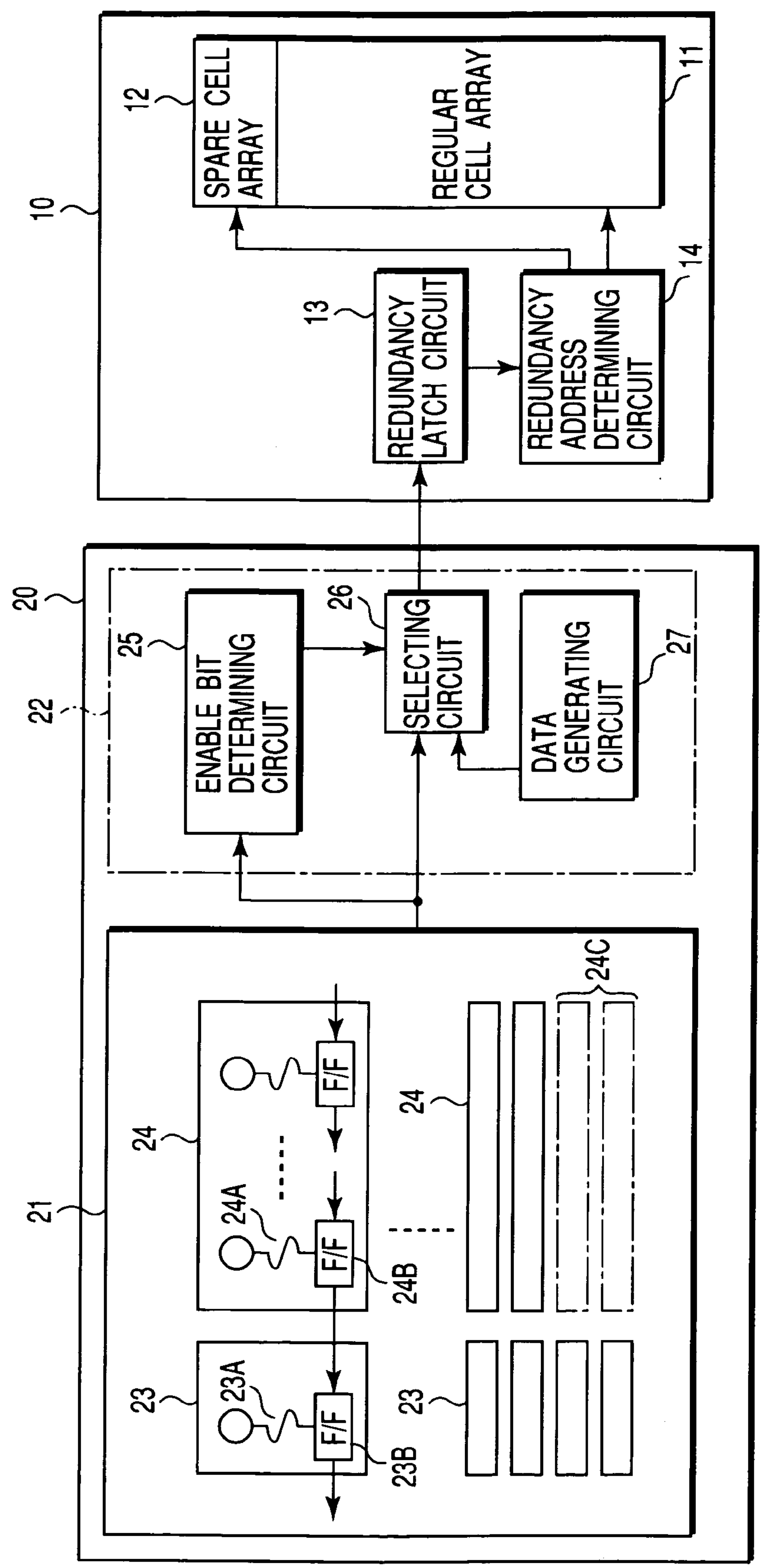
F I G. 3

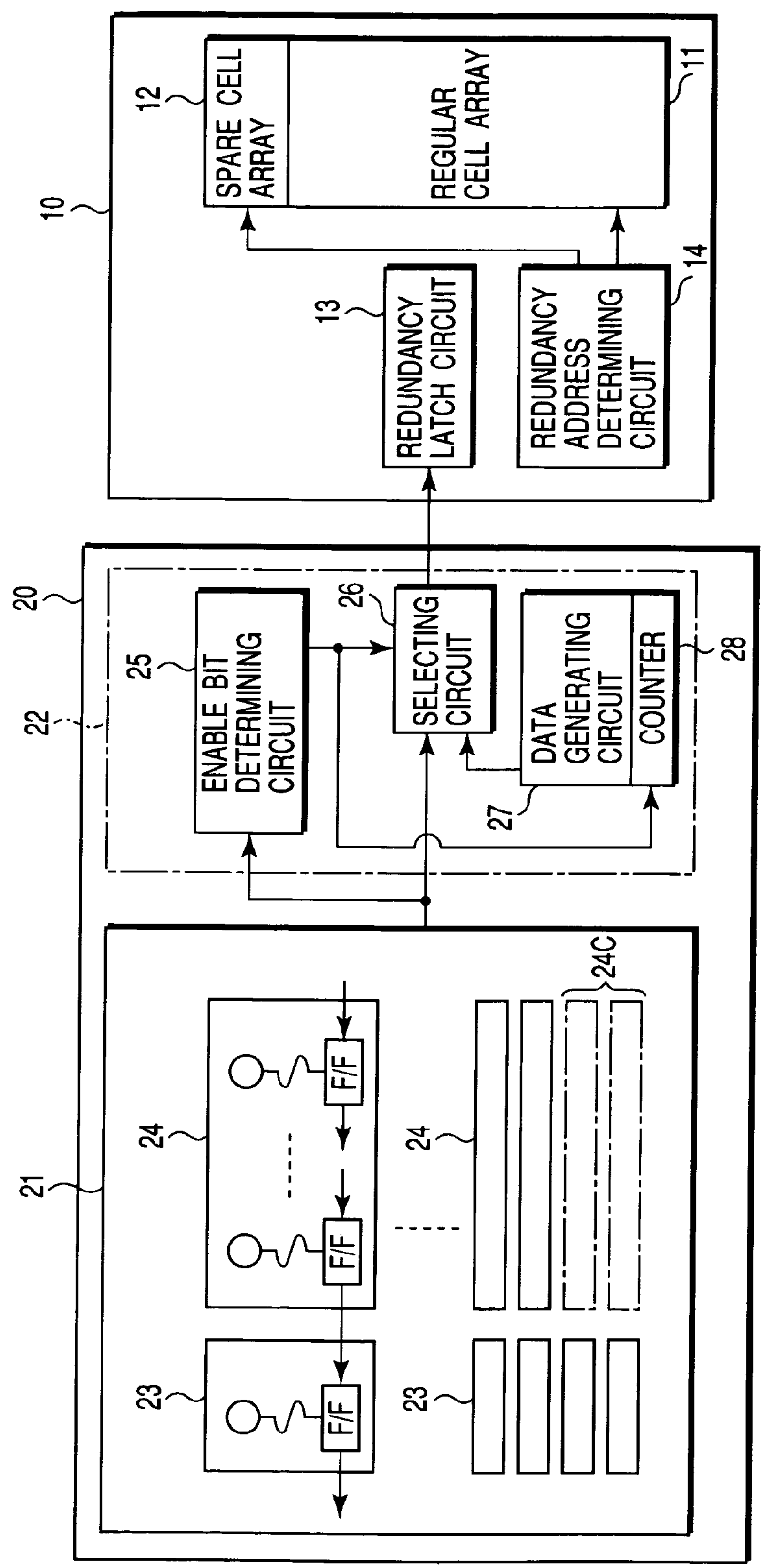
F I G. 6

SEMICONDUCTOR INTEGRATED CIRCUIT PROVIDED WITH SEMICONDUCTOR MEMORY CIRCUIT HAVING REDUNDANCY FUNCTION AND METHOD FOR TRANSFERRING ADDRESS DATA

CROSS-REFERENCE TO RELATED APPLICATIONS

This application is based upon and claims the benefit of priority from prior Japanese Patent Application No. 2003-408587, filed Dec. 8, 2003, the entire contents of which are incorporated herein by reference.

BACKGROUND OF THE INVENTION

1. Field of the Invention

The present invention relates to a semiconductor integrated circuit provided with a semiconductor memory circuit having a redundancy function and a method for transferring address data.

2. Description of the Related Art

A conventional semiconductor memory device has a redundancy function of replacing a regular memory cell with a spare memory cell when the regular memory cell is defective (see, e.g., Jpn. Pat. Appln. KOKAI Publication No. 2000-182394).

FIG. 1 shows the structure of a conventional semiconductor memory circuit having such a redundancy function as mentioned above.

In the conventional semiconductor memory circuit, a fuse box 100 comprises a fuse block 101 and a fuse transferring circuit 102. The fuse block 101 stores enable data and address data. The enable data indicates whether or not a spare memory cell included in a spare cell array 112 is used, and the address data indicate the address of a defective regular memory cell which is replaced with the spare memory cell. The fuse transferring circuit 102 transfers the enable data and the address data to a memory circuit 110. In the following description, data including the enable data and the address data will be referred to as fuse data.

The fuse block 101 comprises enable fuses 103 and address fuses 104. Each of the enable fuses 103 comprises one fuse, and each of the address fuse 104 comprises a number of fuses. The enable fuses 103 pair with the address fuses 104 as respective sets. The sets of enable fuses 103 and address fuses 104 are associated with spare memory cells included in the spare cell array 112, respectively.

The enable fuse 103 stores enable data indicating whether the spare memory cell associated with the enable fuse 103 is used or not. When the enable data indicates that the spare cell memory cell is used, address data indicating the address of a defective regular cell which is replaced with the spare memory cell is stored in the address fuse 104 pairing with the enable fuse 103. On the other hand, when the enable data indicates that the spare memory cell is not used, data "0" is stored in a number of fuses included in the address fuse 104 pairing with the enable fuse 103 storing the enable data.

All fuse data stored in the enable fuses 103 and address fuses 104 is transferred to a redundancy latch circuit 113 included in the memory circuit 110, and the address data indicating the address of the defective regular memory cell which is replaced with the spare memory cell is stored in the redundancy latch circuit 113.

In a method for transferring the fuse data in the above semiconductor memory circuit, it is also necessary to transfer data stored in an address fuse 104 which does not store address data to the redundancy latch circuit 113. Therefore, it is necessary to provide in advance a region for the address fuse not storing address data. Inevitably, the area of a chip must be increased in order to make a semiconductor memory circuit having a greater capacity in the future.

BRIEF SUMMARY OF THE INVENTION

A semiconductor integrated circuit according to an aspect of the present invention comprises: a regular cell array comprising regular memory cells; a spare cell array comprising spare memory cells any of which is used in place of one of the regular memory cells when the one of the regular memory cells is defective; first memory circuits each configured to store data indicating whether an associated one of the spare memory cells is used or not; second memory circuits any of which is used to store address data indicating an address of the one of the regular memory cells which is defective; a determining circuit configured to determine whether each of the spare memory cells is used or not, on the basis of data stored in an associated one of the first memory circuits; a generating circuit configured to generate predetermined data; and a selecting circuit configured to select and output one of the data generated by the generating circuit and address data stored in each of the second memory circuits.

A method according to another aspect of the present invention, for transferring address data in a semiconductor integrated circuit comprising a spare cell array including spare memory cells any of which is used in place of one of regular memory cells in a regular cell array when the one of the regular memory cells is defective, comprises the following operations: data indicating whether each of the spare memory cells is used or not is stored in an associated one of first memory circuits; address data indicating an address of the one of the regular memory cells which is defective is stored in any of second memory circuits; and whether the each spare memory cell is used or not is determined on the basis of the data stored in the associated one of the first memory cells. Then, it is determined that the each spare memory cell is used, address data, which indicates the address of a defective one of the regular memory cells, and which is stored in an associated one of the second memory circuits, is transferred, the defective one of the regular memory cells being replaced with the each spare cell is transferred. On the other hand, when it is determined that the each spare memory cell is not used, the data generated by the generating circuit is transferred.

BRIEF DESCRIPTION OF THE SEVERAL VIEWS OF THE DRAWING

FIG. 3 is a block diagram of the structure of a semiconductor integrated circuit including a semiconductor memory circuit according to the second embodiment of the present invention.

FIG. 6 is block diagram of the structure of a semiconductor integrated circuit according to a first modification of the second embodiment.

DETAILED DESCRIPTION OF THE INVENTION

Figure 1:
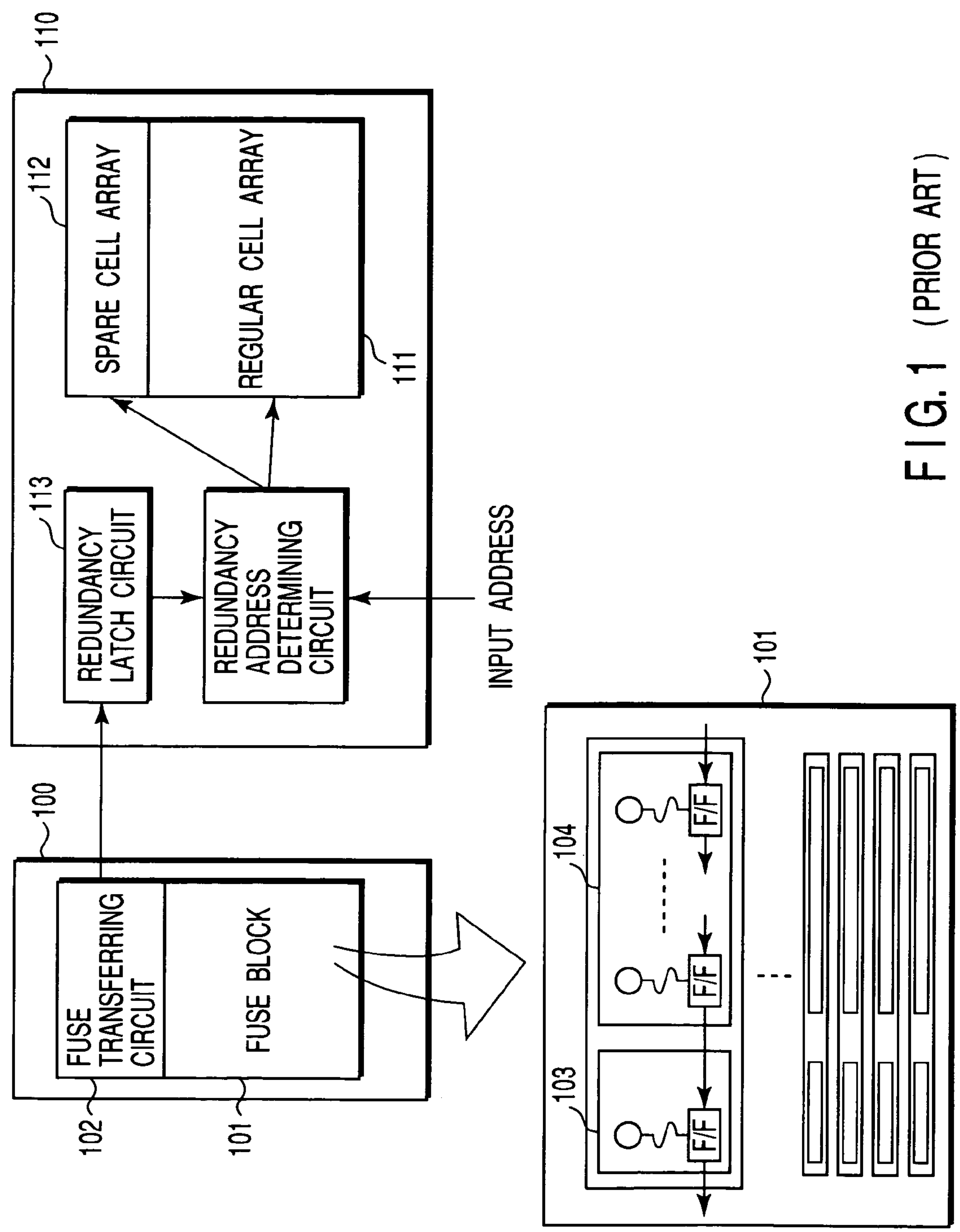
FIG. 1 is a block diagram of the structure of a conventional semiconductor memory circuit having a redundancy function.

The present invention will be explained with reference to the accompanying drawings. The same elements shown in the drawings will be denoted by the same reference numerals, respectively, in the following descriptions.

The First Embodiment

Figure 2:
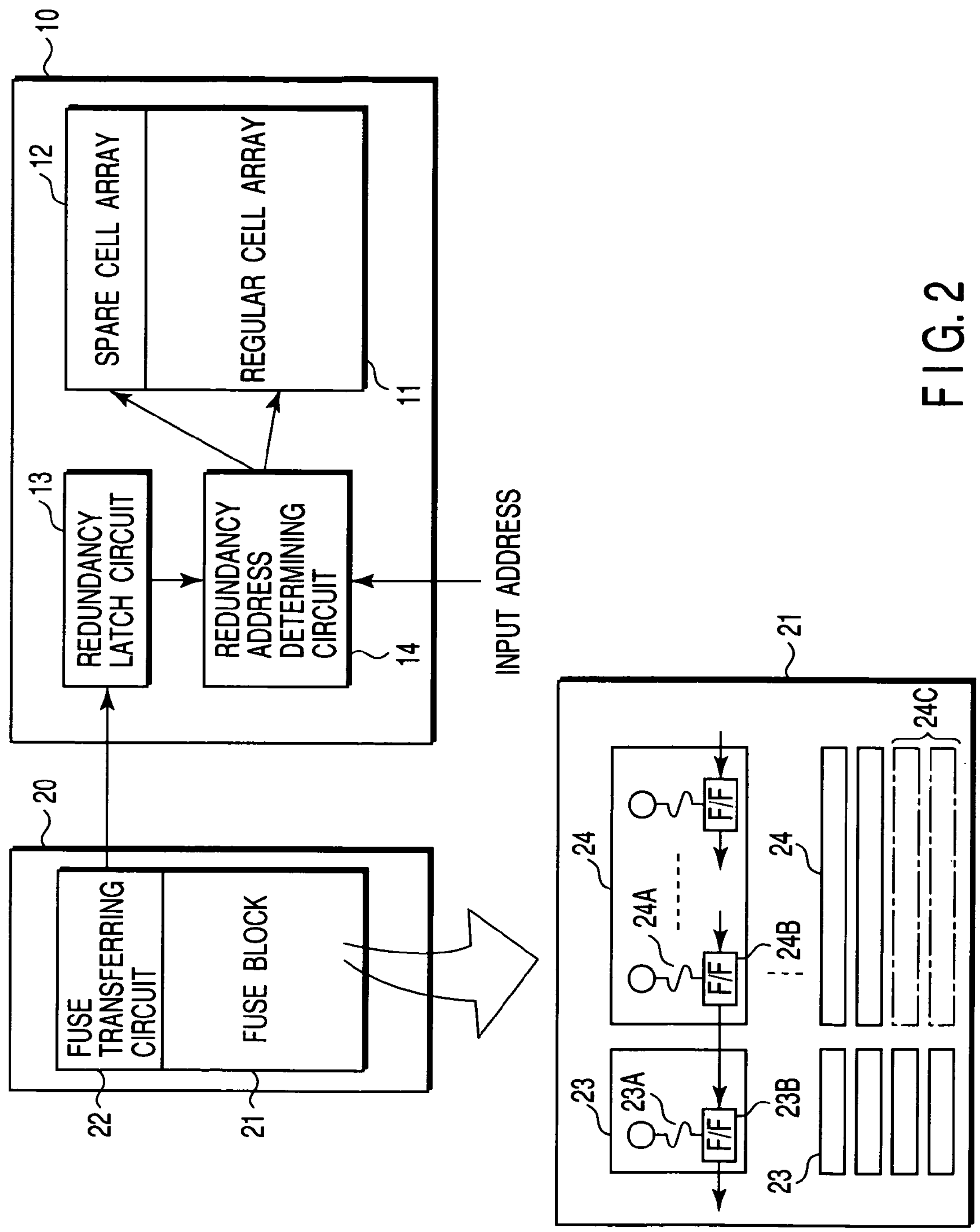
FIG. 2 is a block diagram of the structure of a semiconductor integrated circuit including a semiconductor memory circuit according to the first embodiment of the present invention.

First of all, a semiconductor integrated circuit including a semiconductor memory device having a redundancy function, according to the first embodiment of the present invention, will be explained as follows:

FIG. 2 is a block diagram of the structure of the semiconductor integrated circuit including the semiconductor memory device having the redundancy function, according to the first embodiment of the present invention. As shown in FIG. 2, the semiconductor integrated circuit comprises a memory circuit 10 and a fuse box 20.

The memory circuit 10 comprises a regular cell array 11, a spare cell array 12, a redundancy latch circuit 13 and a redundancy address determining circuit 14. The regular cell array 11 is an array of regular memory cells for storing information. The spare cell array 12 is an array of spare memory cells. If the regular cell array 11 includes a defective regular memory cell, the defective regular memory cell is replaced by a spare memory cell included in the spare cell array 12 to store information. The redundancy latch circuit 13 stores fuse data transferred from the fuse box 20. The fuse data contains address data indicating the address of the defective regular memory cell (which will hereinafter be referred to as a fuse address). The redundancy address determining circuit 14 compares the fuse address indicated by the address data stored in the redundancy latch circuit 13 with an address indicated by address data input from an external device (which will hereinafter be referred to as an input address). Then, when the fuse address is not the same as the input address, the redundancy address determining circuit 14 selects a regular memory cell indicated by the input address. On the other hand, when the fuse address is the same as the input address, the redundancy address determining circuit 14 selects a spare memory indicated by the input address and the fuse address.

The fuse box 20 comprises a fuse block 21 and a fuse transferring circuit 22. The fuse block 20 comprises enable fuses 23 and address fuses 24. The enable fuses 23 store data indicating whether the spare memory cells included in the spare cell array 12 are used or not, respectively. The number of the enable fuses 23 is equal to the number of the spare memory cells included in the spare cell array 12. Each of the address fuses 24 includes a number of fuses for storing address data indicating the address of a regular memory cell, and the number of the address fuses 24 is smaller than that of the memory cells included in the spare cell array 12. Thus, the number of the address fuses 24 is smaller than that of the enable fuses 23. For example, if the regular memory cell array has a storage capacity of 512 bits, the address fuses 24 are set such that each address fuse 24 includes 9 fuses which can store data of 9 bits, and the number of the address fuses 24 is smaller than that of spare memory cells included in the spare cell array 12. Each address fuse 24 is formed to be capable of storing address data indicating the address of a defective regular cell which is replaced with a spare memory cell.

As shown in FIG. 2, each enable fuse 23 comprises a fuse element 23A and a flip-flop 23B which stores data in accordance with whether the fuse element 23A is cut or not. Each address fuse 24 comprises fuse elements 24A and flip-flops 24B which store data in accordance with whether the fuse elements 24A are cut or not, respectively. The flip-flop 23B stores data "1" or "0" when the fuse element 23A is cut, and the flip-flop 24B stores data "1" or "0" when the fuse element 24A is cut. In this case, suppose the flip-flop 23B stores data "1" when the fuse element 23A is cut, and stores data "0" when the fuse element 23A is not cut, and the flip-flop 24B stores data "1" when the fuse element 24A is cut, and stores data "0" when the fuse element 24A is not cut. The flip-flop 23B and the flip-flops 24B are connected in series as shown in FIG. 2, thereby forming a shift register.

In the semiconductor memory circuit having the above structure, the number of the address fuses is decreased, as compared with the conventional semiconductor memory circuit shown in FIG. 1. To be more specific, the number of the address fuses is decreased by omitting the address fuses which are provided in a region denoted by reference numeral 24C in the conventional semiconductor memory circuit as shown in FIG. 2. As a result, the area of a semiconductor substrate which is required for providing the address fuses is reduced, thus restricting an increase in the area of a chip even when a semiconductor memory circuit having a greater capacity is made.

The Second Embodiment

The second embodiment and a modification thereof will be explained by referring to the structure of the fuse transferring circuit in the first embodiment in detail. With respect to the second embodiment and modification, structural elements identical to those in the first embodiment will be denoted by the same reference numerals as in the first embodiment.

FIG. 3 is a block diagram of the structure of a semiconductor integrated circuit including a semiconductor memory circuit according to the second embodiment. The semiconductor integrated circuit, as shown in FIG. 3, comprises a memory circuit 10 and a fuse box 20. The fuse box 20 comprises a fuse block 21 and a fuse transferring circuit 22.

The fuse transferring circuit 22 comprises an enable bit determining circuit 25, a selecting circuit 26 and a data generating circuit 27. The enable bit determining circuit 25 determines the value of an enable bit indicated by each of the enable fuses 23 in the fuse block 21, and outputs a determined result to the selecting circuit 26.

The selecting circuit 26 includes first and second input terminals, a control terminal and an output terminal. To the first input terminal, data stored in the enable fuse 23 and that stored in the address fuse 24 are input. To the second input terminal, arbitrary data "0" or "1" is input from the data generating circuit 27. To the control terminal, the above determined result (the value of the enable bit) is input from the enable bit determining circuit 25. The selecting circuiting 26 selects the data input to the first input terminal or that input to the second input terminal, and then outputs the selected data from the output terminal.

The memory circuit 10 includes a redundancy address determining circuit 14 and a redundancy latch circuit 13 which stores the data output from the selecting circuit 26, and its structure is the same as the structure of the memory circuit 10 in the first embodiment. To be more specific, the redundancy latch circuit 13 stores fuse data transferred from the fuse transferring circuit 22. The fuse data contains enable data stored in an enable fuse 23 and address data which indicates the address (fuse address) of a spare memory cell included in the spare cell array 12. The redundancy address determining circuit 14 compares the address (fuse address) indicated by the fuse data stored in the redundancy latch circuit 13 with an address (input address) indicated by address data which is input from an external device. Then, when the fuse address is not the same as the input address, the redundancy address determining circuit 14 selects a regular memory cell indicated by the input address. On the other hand, when the fuse address is the same as the input address, the redundancy address determining circuit 14 selects a spare memory cell indicated by the input address and the fuse address.

Also, the fuse box 21, as well as that in the first embodiment, comprises enable fuses 23 and address fuses 24. The enable fuses 23 each comprises one fuse which stores data of 1 bit, and are respectively associated with the spare memory cells included in the spare cell array 12. That is, the number of the enable fuses 23 in the fuse block 21 is equal to that of the spare memory cells in the spare cell array 12. The enable fuses 23 store data "1" or "0" indicating whether the memory cells in the spare cell array 12 are used or not, respectively. In the following description, suppose data "1" indicates that a spare memory cell is used, and data "0" indicates that the spare memory cell is not used. Each of the address fuses 24 is formed to include a plurality of fuses for storing bits indicating the address of a defective regular cell which is replaced with a spare memory cell. The number of the address fuses 24 in the fuse block 21 is smaller than that of the memory cells in the spare cell array 12. The total number of fuses included in the enable fuses 23 and address fuses 24 in the fuse block 21 is smaller than the number of bits which can be stored in the redundancy latch circuit 13. In other words, it is smaller than the number of memory elements included in the redundancy latch circuit 13.

Next, the operation of the semiconductor integrated circuit including the semiconductor memory circuit, shown in FIG. 3, according to the second embodiment, will be explained.

Figure 4:
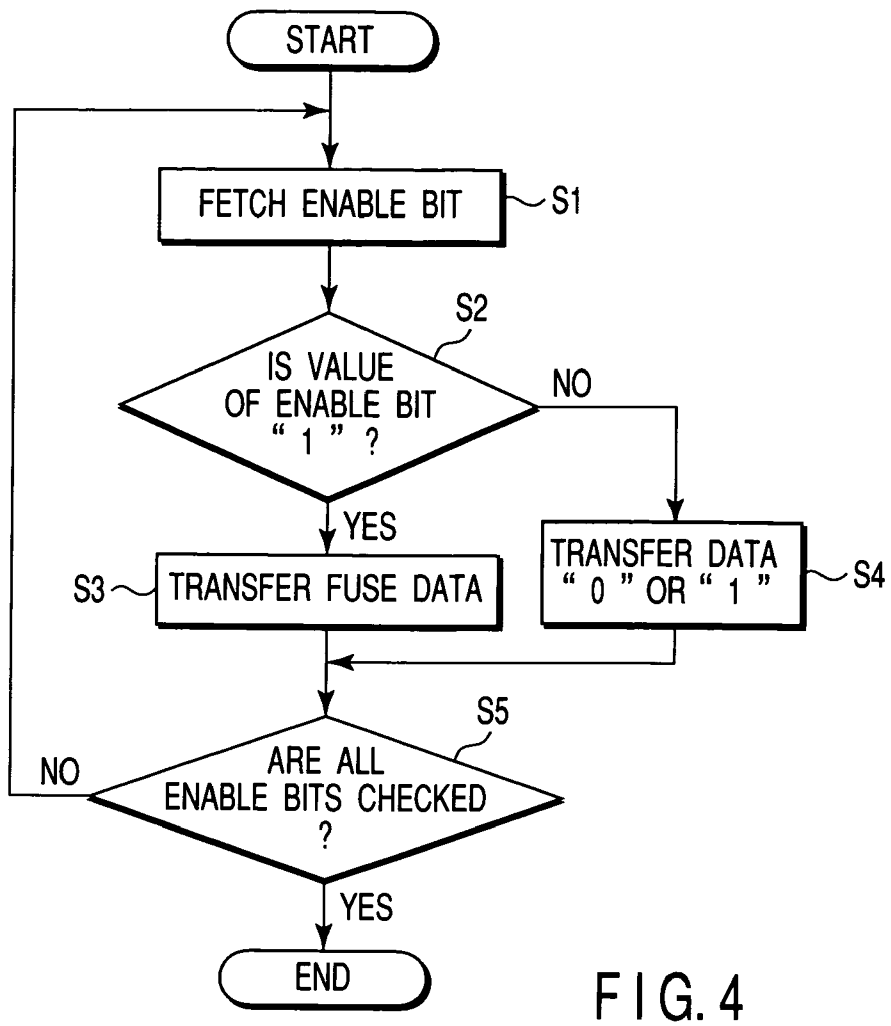
FIG. 4 is a flowchart explaining an operation of the semiconductor integrated circuit including the semiconductor memory circuit according to the second embodiment of the present invention.

FIG. 4 is a flowchart explaining the operation of the semiconductor integrated circuit including the semiconductor memory circuit according to the second embodiment.

First of all, the enable bit determining circuit 25 fetches an enable bit output from the fuse block 21 (Step S1), and determines whether the value of the enable bit is "1" or not (Step S2).

A result of determination by the enable bit determining circuit 25 is output to the selecting circuit 26. When the value of the enable bit is "1" (Yes), since an associated spare memory cell is used, the selecting circuit 26 selects the fuse address indicated by the address data stored in an address fuse 24, which is output from the fuse block 21, and transfers it to the redundancy latch circuit 13 as address data indicating the address of a defective regular cell which is replaced with a spare memory cell (Step S3). On the other hand, when the enable bit is not "1" (No), since the associated spare memory cell is not used, the selecting circuit 26 selects data "0" or "1" generated by the data generating circuit 27, and transfers data of given bits, each of which indicates "0" or "1" which is selected, and the number of which is equal to the number of bits indicating an address, to the redundancy latch circuit 13 (Step S4).

Next, it is determined whether or not all the enable bits are checked or not (Step S5). When it is determined that not all the enable bits are checked, processing to be performed is returned to step S1, and processing from step S1 to step S5 is re-performed. On the other hand, when it is determined that all the enable bits are checked, the processing is ended.

The operation of the semiconductor integrated circuit according to the second embodiment will be explained by referring to a data string output from the fuse box 21 and that transferred from the fuse transferring circuit 22.

Figure 5:
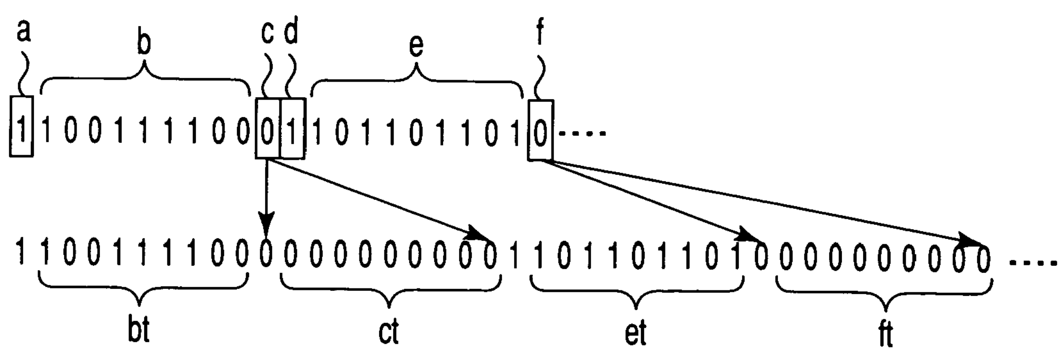
FIG. 5 is a view showing an example of input data and output data in a fuse transferring circuit in the second embodiment.

FIG. 5 shows an example of data input from the fuse box 21 to the fuse transferring circuit 22 (shown in the upper part of FIG. 5), and an example of data transferred from the fuse transferring circuit 22 to the memory circuit 10 (in the lower part of FIG. 5).

In the data in the upper part of FIG. 5, data denoted by reference characters a, c, d and f is data stored in enable fuses 23, and data denoted by reference characters b and e is data stored in address fuses 24.

First, the enable bit determining circuit 25 fetches the data a, and determines whether the data a is "1" or not. In the case shown in FIG. 5, since the data a is "1", the selecting circuit 26 selects the data b following the data a, which is data consisting of nine bits, and transfers the data b to the redundancy latch circuit 13 from the output terminal (as data denoted by reference character bt).

Then, the enable bit determining circuit 25 fetches the data c, and determines whether the data c is "1" or not. In the case shown in FIG. 5, since the data c is "0", the selecting circuit 26 selects data "0" generated from the data generating circuit 27, and transfers data "000000000" (nine bits) denoted by a reference character ct to the redundancy latch circuit 13 from the output terminal.

Next, the enable bit determining circuit 25 fetches the data d, and determines whether the data d is "1" or not. In the case shown in FIG. 5, since the data d is "1", the selecting circuit 26 selects the data e expressed by nine bits and following the data d, and transfers the data e to the redundancy latch circuit 13 from the output terminal (as data denoted by reference character et). Furthermore, the enable bit determining circuit 25 fetches the data f, and determines whether the data f is "1" or not. In the case shown in FIG. 5, since the data f is "0", the selecting circuit 26 selects data "0" generated by the data generating circuit 27, and transfers data "000000000" (nine bits) denoted by a reference character ft to the redundancy latch circuit 13 from the output terminal.

Each of the data b, the data e, the data bt, the data ct, the data et and the data ft consists of nine bits as stated above, and indicates an address. To be more specific, each data consists of bits the number of which is set to indicate the address of a regular memory cell included in the regular cell array having a storage capacity of 512 bits. The number of bits expressing the data is not limited to nine. It may be set to any number in accordance with the storage capacity of the regular cell array as long as it can indicate the address of a regular memory cell in the regular cell array. The data shown in the upper part of FIG. 5 is stored in enable fuses 23 and address fuses 24 in the fuse block 21, and the number of bits expressing the data is equal to the total number of the fuses included in the enable fuses 23 and address fuses 24 in the fuse block 21. The data shown in the lower part of FIG. 5 is data which is transferred from the fuse transferring circuit 22, and stored in the redundancy latch circuit 13 in the memory circuit 10. The redundancy latch circuit 13 includes memory elements, e.g., flip-flops, the number of which is set such that they can store all the data shown in the lower part of FIG. 5.

As stated above, the data string shown in the upper part of FIG. 5, which is output from the fuse box 21, is processed in the fuse transferring circuit 22, and the data string in the lower part of FIG. 5 is transferred from the output terminal of the selecting circuit 26, and stored in the redundancy latch circuit 13. Then, the subsequent operation is performed in the same manner as in the first embodiment.

In the semiconductor integrated circuit having the above structure, the number of the address fuses 24 is not set to be equal to that of the enable fuses 23, i.e., it is set to be smaller than that of the enable fuses 23. In other words, the total number of the fuses included in the enable fuses 23 and address fuses 24 is smaller than the number of memory elements each capable of storing 1 bit, which are included in the redundancy latch circuit. Thereby, the region of the semiconductor substrate which is required for formation of the address fuses 24 can be reduced, thus restricting an increase in the area of the chip even when a semiconductor memory circuit having a greater capacity is made.

Next, a semiconductor integrated circuit including a semiconductor memory circuit according to the first modification of the second embodiment of the present invention will be explained.

FIG. 6 is a block diagram of the structure of the semiconductor integrated circuit according to the first modification of the second embodiment. The fuse transferring circuit 22 shown in FIG. 6 includes a counter 28, in addition to the structure of the fuse transferring circuit disclosed in FIG. 3. The counter 27 counts the number of times data is generated by the data generating circuit 27. The count value obtained by the counter 28 is used in controlling the number of data generated by the data generating circuit 27. To be more specific, to the counter 28, a result of determination by the enable bit determining circuit 25 is input. The counter 28 counts the number of data generated by the data generating circuit 27, when an enable bit is "0", i.e., address data is not stored in an associated address fuse 24. The count value obtained by the counter 28 is used in controlling the number of times data is generated by the data generating circuit 27 such that the number is equal to the number of bits expressing the address indicated by address data (which is nine in the case shown in FIG. 5). The other structural features and operations in the above first modification are the same as in the second embodiment.

Then, a semiconductor integrated circuit including a semiconductor memory circuit according the second modification of the second embodiment of the present invention will be explained.

Figure 7:
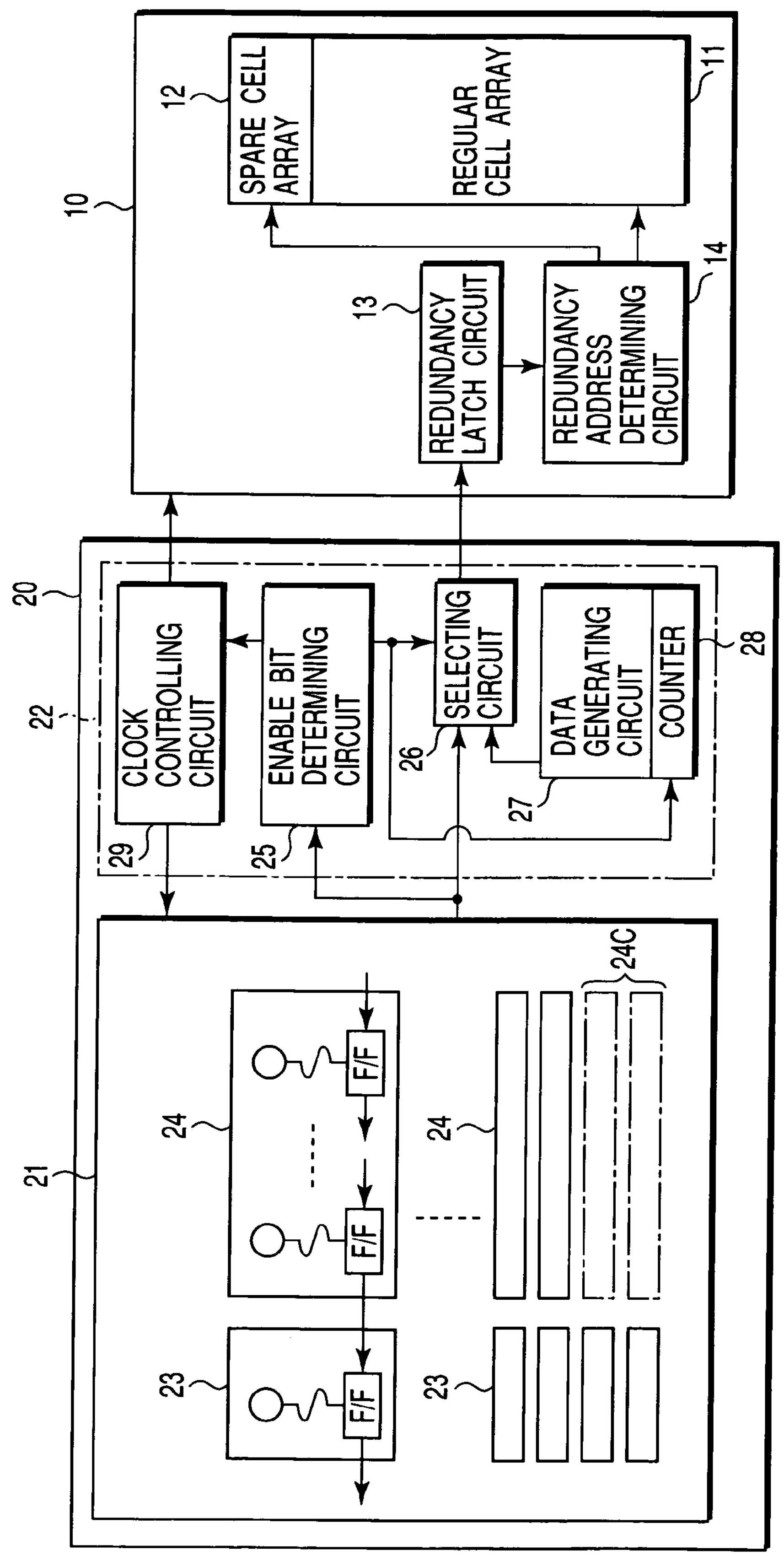
FIG. 7 is block diagram of the structure of a semiconductor integrated circuit according to a second modification of the second embodiment.

FIG. 7 is a block diagram of the structure of the semiconductor integrated circuit according to the second modification of the second embodiment. The fuse transferring circuit 22 shown in FIG. 7 includes a counter 28 and a clock controlling circuit 29, in addition to the structure of the fuse transferring circuit disclosed in FIG. 3. The counter 28, as stated above, counts the number of times data is generated by the data generating circuit 27, when a result of determination which indicates that an enable bit is "0" is input from the enable bit determining circuit 25. The count value obtained by the counter 28 is used in controlling the number of data generated by the data generating circuit 27.

The clock controlling circuit 29 supplies a clock for controlling transferring of the data stored in each of the enable fuses 23 and address fuses 24 in the fuse box 21 to the fuse box 21. In addition, the clock controlling circuit 29 supplies a clock, which is to be used in the redundancy latch circuit 13 to control transferring of the data output from the selecting circuit 26, to the redundancy latch circuit 13. The other structural features and operations in the above second modification are the same as in the second embodiment.

According to the embodiments and modifications of the present invention, it is not necessary to provide all fuses designed to respectively store the addresses of all the spare memory cells. Thus, a semiconductor integrated circuit can be provided which includes a semiconductor memory circuit in which an increase in the area of the chip can be restricted even when it is required to provide a larger storage capacity.

Moreover, the above embodiments and modifications can be individually put to practical use. Also, they can be put to practical use in combination. Furthermore, they contain a number of inventive aspects at different levels. Thus, a number of inventions at different levels can be extracted by properly selectively combining the structural elements disclosed above with respect to the embodiments and modifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:

a regular cell array comprising regular memory cells;

a spare cell array comprising spare memory cells any of which is used in place of one of the regular memory cells when said one of the regular memory cells is defective;

first memory circuits each configured to store data indicating whether an associated one of the spare memory cells is used or not;

second memory circuits any of which is used to store address data indicating an address of said one of the regular memory cells which is defective;

a determining circuit configured to determine whether each of the spare memory cells is used or not, on the basis of data stored in an associated one of the first memory circuits;

a generating circuit configured to generate predetermined data; and a selecting circuit configured to select and output one of the data generated by the generating circuit and address data stored in each of the second memory circuits.

2. The semiconductor integrated circuit according to claim 1, wherein the number of the second memory circuits is smaller than that of the spare memory cells in the spare cell array.

3. The semiconductor integrated circuit according claim 1, wherein when a result of determination by the determining circuit indicates that said each spare memory cell is used, the selecting circuit selects the address data stored in an associated one of the second memory circuits, and when the result of determination by the determining circuit indicates that said each spare memory cell is not used, the selecting circuit selects the data generated by the generating circuit.

4. The semiconductor integrated circuit according to claim 1, which further comprises:

third memory circuits including shift registers and each configured to store the data output from the selecting circuit; and an address determining circuit configured to compare the data stored in said each of the third memory circuits with address data input from an external device.

5. The semiconductor integrated circuit according to claim 1, which further comprises a counter configured to count the number of times the data is generated by the data generating circuit.

6. The semiconductor integrated circuit according to claim 1, which further comprises a clock controlling circuit configured to generate a clock signal for use in controlling timing of transferring each of the data stored in said each first memory circuit and the data stored in said each second memory circuit.

7. The semiconductor integrated circuit according to claim 6, wherein the clock controlling circuit generates a clock signal for use in controlling a data shifting timing of the shift register of said each third memory circuit.

8. The semiconductor integrated circuit according to claim 1, wherein said each first memory circuit comprises a fuse element and a flip-flop configured to store data in accordance with whether the fuse element is cut or not, and said each second memory circuit comprises a plurality of fuse elements and a plurality of flip-flops configured to store data in accordance with whether the fuse elements are cut or not, respectively.

9. The semiconductor integrated circuit according to claim 8, wherein the flip-flop in said each first memory circuit and the plurality of flip-flops in said each second memory circuit are connected in series, thereby forming a shift register.

10. A method for transferring address data in a semiconductor integrated circuit comprising a spare cell array including spare memory cells any of which is used in place of one of regular memory cells in a regular cell array when said one of the regular memory cells is defective, storing data indicating whether each of the spare memory cells is used or not, in an associated one of first memory circuits;

storing address data indicating an address of said one of the regular memory cells which is defective, in any of second memory circuits; and determining whether said each spare memory cell is used or not, on the basis of the data stored in said associated one of the first memory cells, and then transferring, when determining that said each spare memory cell is used, address data which indicates an address of a defective one of the regular memory cells, and which is stored in an associated one of the second memory circuits, said defective one of the regular memory cells being replaced with said each spare cell, and transferring, when determining that said each spare memory cell is not used, the data generated by the generating circuit.

11. The method according to claim 10, which further comprises:

storing, in an associated one of third memory circuits, the address data indicating the address of said associated one of the regular memory cells and the data generated by the generating circuit; and comparing the data stored in said associated one of the third circuits with address data input from an external device, and determining whether or not the address indicated by the data stored in said associated one of the third memory circuits is the same as an address indicated by the address data input from the external device.

12. The method according to claim 10, wherein each of the first memory circuits comprises one fuse element, and each of the second memory circuits comprises a plurality of fuse elements.

13. The method according to claim 12, wherein:

said storing the data indicating whether said each spare memory cell is used or not, in said associated one of the first memory circuits, is achieved by cutting or not cutting the fuse element in said associated one of the first memory circuits; and said storing address data indicting the address of said one of the regular memory cells which is defective, in said any of second memory circuits, is achieved by cutting or not cutting each of the plurality of fuse elements in said any second memory circuit.

* * * * *